(12) United States Patent
Genrikh et al.

(10) Patent No.: US 7,417,271 B2
(45) Date of Patent: Aug. 26, 2008

(54) ELECTRODE STRUCTURE HAVING AT LEAST TWO OXIDE LAYERS AND NON-VOLATILE MEMORY DEVICE HAVING THE SAME

(75) Inventors: Stefanovich Genrikh, Suwon-si (KR); Choong-rae Cho, Gimhae-si (KR); In-kyeong Yoo, Suwon-si (KR); Eun-hong Lee, Anyang-si (KR); Sung-Il Cho, Boryeong-si (KR); Chang-wook Moon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/655,193

(22) Filed: Jan. 19, 2007

(65) Prior Publication Data

US 2007/0200158 A1    Aug. 30, 2007

(30) Foreign Application Priority Data

Feb. 27, 2006   (KR) ............... 10-2006-0018879

(51) Int. Cl.
*H01L 31/062* (2006.01)

(52) U.S. Cl. ............. 257/289; 257/223; 257/229; 257/368; 257/E21.011; 257/E21.047

(58) Field of Classification Search .......... None
See application file for complete search history.

(56) References Cited

U.S. PATENT DOCUMENTS

| 5,003,428 A * | 3/1991 | Shepherd ............... 361/322 |
| 6,617,628 B2 * | 9/2003 | Kim ............... 257/295 |
| 2005/0199961 A1 * | 9/2005 | Hoffman et al. ............ 257/368 |

* cited by examiner

*Primary Examiner*—A. Sefer
*Assistant Examiner*—Scott R Wilson
(74) *Attorney, Agent, or Firm*—Harness, Dickey & Pierce, P.L.C.

(57) ABSTRACT

An electrode structure having at least two oxide layers that more reliably switch and operate without the use of additional devices and a non-volatile memory device having the same are provided. The electrode structure may include a lower electrode, a first oxide layer formed on the lower electrode, a second oxide layer formed on the first oxide layer and an upper electrode formed on the second oxide layer wherein at least one of the first and second oxide layers may be formed of a resistance-varying material. The first oxide layer may be formed of an oxide having a variable oxidation state.

19 Claims, 4 Drawing Sheets

ELECTRODE STRUCTURE HAVING AT LEAST TWO OXIDE LAYERS AND NON-VOLATILE MEMORY DEVICE HAVING THE SAME

PRIORITY STATEMENT

This application claims the benefit of priority under 35 U.S.C. §119 from Korean Patent Application No. 10-2006-0018879, filed on Feb. 27, 2006 in the Korean Intellectual Property Office, the disclosure of which is incorporated herein in its entirety by reference.

BACKGROUND

1. Field

Example embodiments relate to an electrode structure having at least two oxide layers and a non-volatile memory device having the same. Other example embodiments relate to an electrode structure having at least two oxide layers that more reliably switch and/or may operate without the use of additional devices and a non-volatile memory device having the same.

2. Description of the Related Art

The development of semiconductor memory devices having higher integration, higher operation speed and/or lower power consumption (e.g., a large number of memory cells per unit area) has been the focus of recent research.

A related art semiconductor memory device may include a plurality of memory cells. If the semiconductor device is a dynamic random access memory (DRAM), then a unit memory cell may include a switch and a capacitor. The DRAM may have higher integration and/or higher operation speed. If power to the DRAM is removed, then data stored in the DRAM may be lost.

Non-volatile memory devices may preserve stored data even after the power is removed. The non-volatile memory device may be a flash memory. The flash memory may have lower integration and/or lower operation speed compared to a DRAM.

Recent research on non-volatile memory devices focuses on magnetic random access memory (MRAM), ferroelectric random access memory (FRAM), phase-change random access memory (PRAM) and resistance random access memory (RRAM).

The RRAM may utilize a resistance transition characteristic of a transition metal oxide wherein resistance varies according to a change in voltage.

FIG. 1 is a diagram illustrating a cross-sectional view of an electrode of a related art resistive random access memory device (RRAM).

An RRAM may be formed of a material having a variable resistance. The material having the variable resistance may be a transition metal oxide (TMO). The material may have a switching characteristic, thereby functioning as a memory device.

Referring to FIG. 1, a lower electrode 12, an oxide layer 14 and an upper electrode 16 may be sequentially formed on a substrate 10. The lower electrode 12 and the upper electrode 16 may be formed of a conductive material. The oxide layer 14 may be formed of a transition metal oxide having a variable resistance characteristic. The oxide layer 14 may be formed of zinc oxide (ZnO), titanium dioxide ($TiO_2$), niobium oxide ($Nb_2O_5$), zirconium dioxide ($ZrO_2$), or nickel oxide (NiO).

If the semiconductor device is a Perovskite-RRAM, then the switching material may be a Perovskite oxide (e.g., PCMO ($PrCaMnO_3$) or Cr-STO($SrTiO_3$)). Memory characteristics of a Perovskite-RRAM may be established by applying voltage polarities to memory nodes of the Perovskite-RRAM using the principle of Schottky Barrier Deformation.

SUMMARY

Example embodiments relate to an electrode structure having at least two oxide layers and a non-volatile memory device having the same. Other example embodiments relate to an electrode structure having at least two oxide layers that more reliably switch and/or may operate without the use of additional devices and a non-volatile memory device having the same.

Example embodiments provide a non-volatile memory device having at least two oxide layers, a less complex construction and/or increased switching characteristics for more reliable operation.

According to example embodiments, an electrode structure may include a lower electrode, a first oxide layer formed on the lower electrode wherein the first oxide layer is formed of an oxide having a variable oxidation state, a second oxide layer formed on the first oxide layer and an upper electrode formed on the second oxide layer, wherein at least one of the first and second oxide layers are formed of a resistance-varying material.

The lower electrode may be formed of a metal or a metal oxide that forms a schottky contact with the first oxide layer. The first oxide layer may be formed of a transition metal oxide. The transition metal oxide may be at least one selected from the group consisting of NiO, $CeO_2$, $VO_2$, $V_2O_5$, $Nb_2$, $Nb_2O_5$, $TiO_2$, $Ti_2O_3$, $WO_3$, $Ta_2O_5$ or $ZrO_2$.

The second oxide layer may be formed of an amorphous oxide. The amorphous oxide may be InZnO (IZO) or InSnO (ITO).

The lower electrode may be a metal selected from the group including platinum (Pt), ruthenium (Ru) and iridium (Ir). The lower electrode may be a metal oxide. The metal oxide may be a transition metal oxide including platinum (Pt), ruthenium (Ru) or iridium (Ir).

The upper electrode may be a metal selected from the group including platinum (Pt), ruthenium (Ru) and iridium (Ir). The upper electrode may be a metal oxide. The metal oxide may be a transition metal oxide including platinum (Pt), ruthenium (Ru) or iridium (Ir). In other example embodiments, the upper electrode may be formed of titanium (Ti) or silver (Ag).

According to other example embodiments, a non-volatile memory device may include a first and second impurity region formed in a substrate, a gate electrode including a conductive layer and a capping layer sequentially stacked on the substrate and contacting the first and second impurity regions, an interlayer formed on the gate electrode, the first impurity region and the second impurity region, a conductive plug formed in the interlayer and contacting one of the first or second impurity regions and an electrode structure formed on the conductive plug and a portion of the interlayer.

BRIEF DESCRIPTION OF THE DRAWINGS

Example embodiments will be more clearly understood from the following detailed description taken in conjunction with the accompanying drawings. FIGS. 2-5 represent non-limiting, example embodiments as described herein.

FIG. 2 is a diagram illustrating a cross-sectional view of an electrode structure having at least two oxide layers according to example embodiments;

FIG. 3 is a diagram illustrating a cross-sectional view of a non-volatile memory device having an electrode with at least two oxide layers according to example embodiments;

FIG. 4 is a current-voltage graph illustrating the operation principle of a non-volatile memory device having at least two oxide layers according to example embodiments;

DETAILED DESCRIPTION OF EXAMPLE EMBODIMENTS

Figure 1:
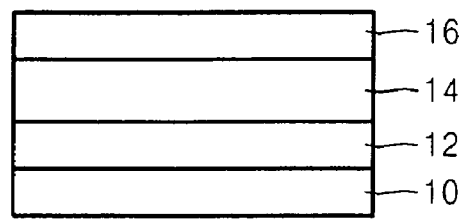
FIG. 1 is a diagram illustrating a cross-sectional view of an electrode structure of a related art resistive random access memory device.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described. The thicknesses of layers and regions are exaggerated for clarity.

Example embodiments relate to an electrode structure having at least two oxide layers and a non-volatile memory device having the same. Other example embodiments relate to an electrode structure having at least two oxide layers that more reliably switch and operate without the use of additional devices and a non-volatile memory device having the same.

Figure 2:
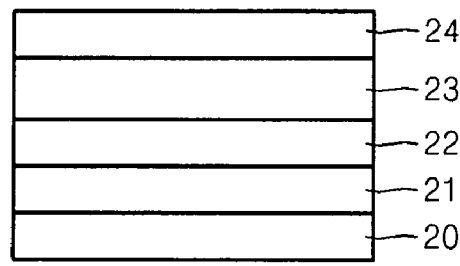

FIG. 2 is a diagram illustrating a cross-sectional view of an electrode structure having at least two oxide layers according to example embodiments.

Referring to FIG. 2, an electrode 25 may include a substrate 20, a lower electrode 21, a first oxide layer 22, a second oxide layer 23 and an upper electrode 24, sequentially formed on the substrate 20. The substrate 20 may be formed of silicon (Si), silicon dioxide ($SiO_2$), silicon carbide (SiC) or likewise.

The lower electrode 21 may be formed of a metal or a metal oxide which forms a schottky contact with an oxide. If the first oxide layer 22 is formed of an n-type oxide (e.g., $TiO_2$), then the lower electrode 21 may be formed of a material having a relatively high work function, for example, platinum (Pt), ruthenium (Ru), iridium (Ir), iridium oxide ($IrO_x$) or likewise. If the first oxide layer 22 is formed of a p-type oxide (e.g., nitrogen oxide (NiO)), then the lower electrode 21 may be formed of a material having a lower work function (e.g., titanium (Ti) or silver (Ag)).

The first oxide layer 22 may be formed of a material having a lower electron conductivity, a higher oxygen conductivity and two resistance states. The material may be a transition metal oxide. The transition metal oxide may be nickel oxide (NiO), cesium dioxide ($CeO_2$), a vanadium oxide ($VO_2$ or $V_2O_5$), niobium ($Nb_2$), niobium oxide ($Nb_2O_5$), a titanium oxide ($TiO_2$ or $Ti_2O_3$), tungsten oxide ($WO_3$), tantalum oxide ($Ta_2O_5$) or zirconium oxide ($ZrO_2$).

The second oxide layer 23 may be formed of a material having a higher oxygen vacancy concentration. A resistance of the material of the second oxide layer 23 may not vary in relation to a concentration of oxygen ions in the material. The second oxide layer 23 may be formed of an amorphous oxide having significant defects (e.g., IZO (InZnO) or ITO (InSnO)).

The upper electrode 24 may be formed of a metal or a metal oxide that forms an ohmic contact with an oxide. The upper electrode 24 may be formed of platinum (Pt), ruthenium (Ru), iridium (Ir), iridium oxide ($IrO_x$) or the like.

According to example embodiments, the non-volatile memory device having the at least two oxide layers may be manufactured using a physical vapor deposition (PVD) process (e.g., sputtering, an atomic layer deposition (ALD) process, a CVD process or similar process). The thicknesses of the respective layers may not be limited. The thickness of the respective layers may be adjusted between several nanometers and several micrometers.

Although the electrode structure shown in FIG. 2 has a unit structure, the electrode structure may have a cross-point structure and/or may be used in an array form according to other example embodiments.

A non-volatile memory having at least two oxide layers and operation thereof according to example embodiments will now be described in detail with reference to the attached drawings.

Figure 3:
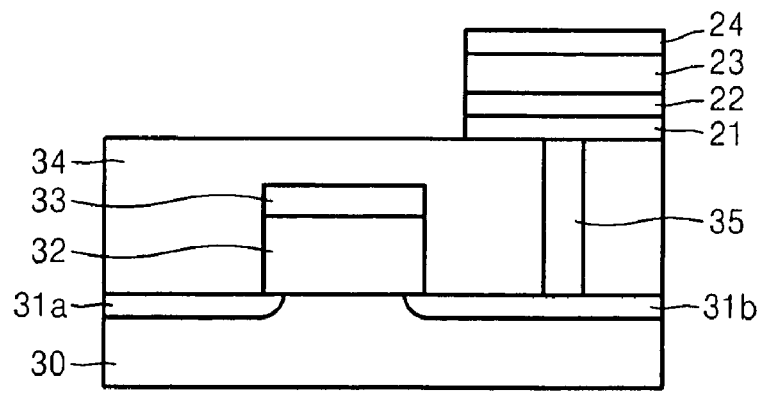

FIG. 3 is a diagram illustrating a cross-sectional view of a non-volatile memory device having an electrode with at least two oxide layers according to example embodiments.

Referring to FIG. 3, impurity regions 31a and 31b may be formed in a substrate 30. The impurity regions 31a and 31b may be source and drain regions, respectively. A gate electrode 36 may be formed contacting the impurity regions 31 and 31b. The gate electrode 36 may be formed of a conductive layer 32 and a capping layer 33, sequentially stacked.

An interlayer 34 may be formed on (or surrounding) the gate electrode 36. The interlayer 34 may be formed on the impurity regions 31a and 31b. A contact hole may be formed through the interlayer 34 over the impurity region 31b. The contact hole may be filled with a conductive plug 35. The conductive plug 35 may contact the impurity region 31b.

An electrode structure 325 may be formed on the interlayer 34 and the conductive plug 35. The electrode structure 325 may have a lower electrode 341, a first oxide layer 342, a second oxide layer 343 and an upper electrode 344, sequentially stacked.

The lower electrode 341, the first oxide layer 342, the second oxide layer 343 and the upper electrode 344 may be similar to the lower electrode 21, the first oxide layer 22, the second oxide layer 23 and the upper electrode 24 described with reference to FIG. 2. Therefore, a brief description thereof will be omitted for the sake of brevity.

Figure 4:
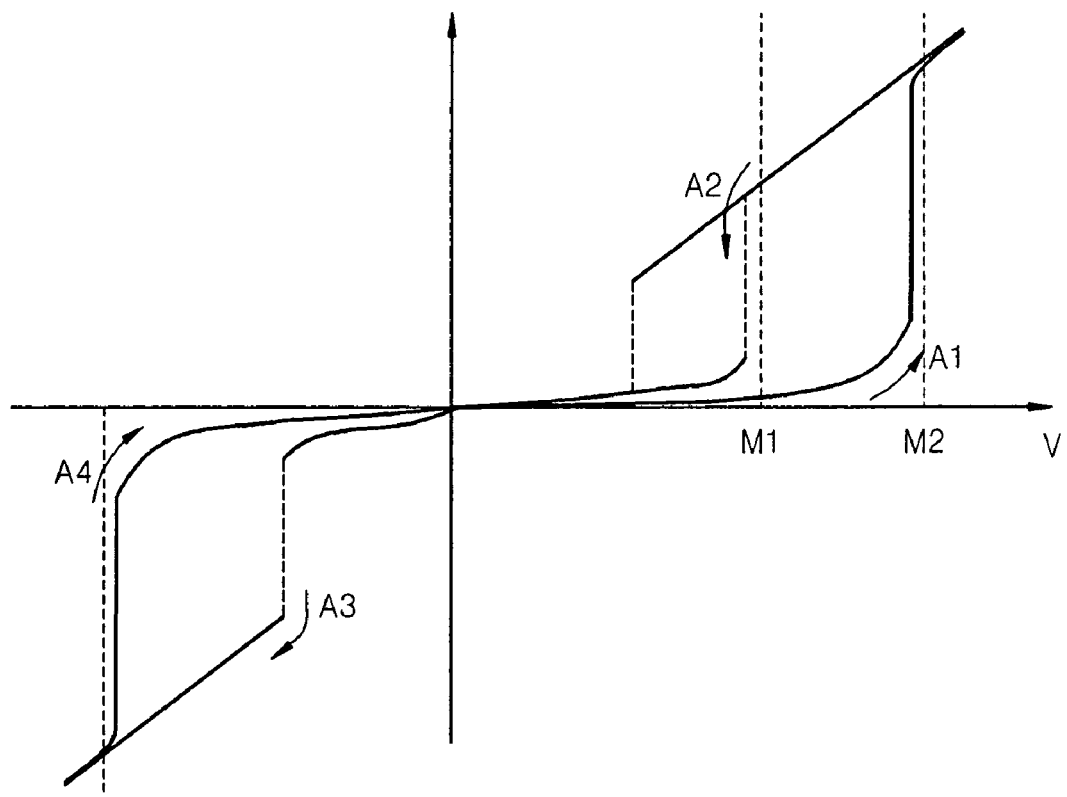

FIG. 4 is a current-voltage graph illustrating the operation principle of a non-volatile memory device having at least two oxide layers according to example embodiments. The first oxide layer was formed of titanium dioxide ($TiO_2$). The second oxide layer was formed of IZO. The lower and upper electrodes were formed of an iridium oxide ($IrO_x$).

Figure 5A:
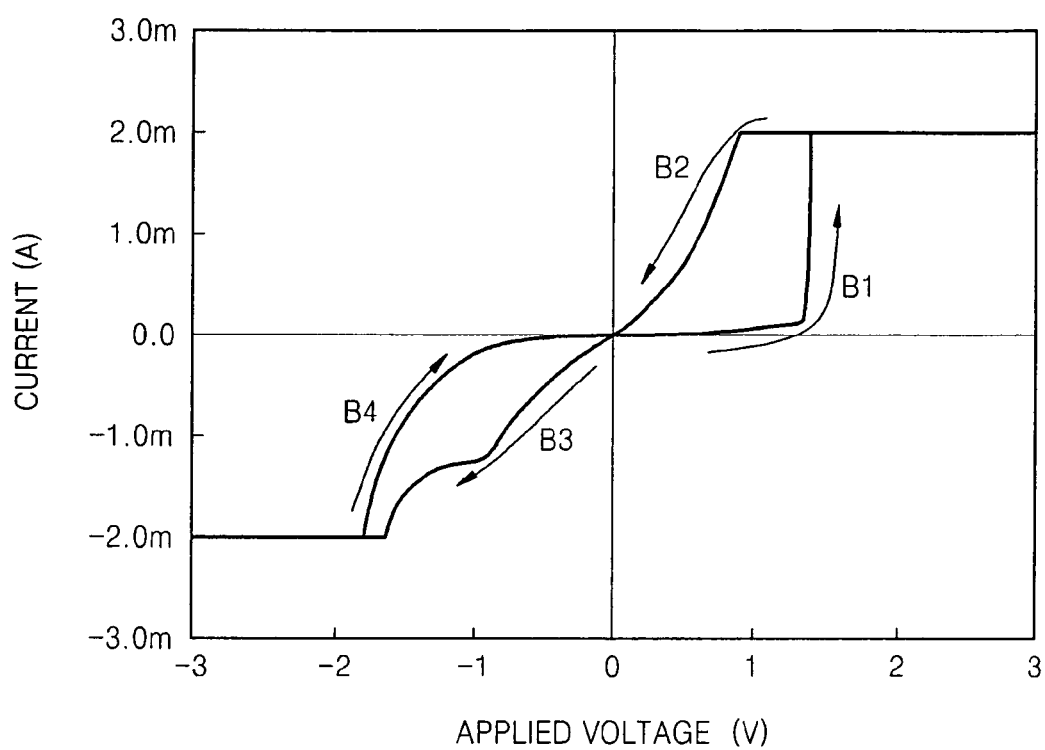
FIG. 5A is a current-voltage graph obtained by measuring current-voltage characteristics of a non-volatile memory device wherein a second oxide layer is formed of IZO (InZO) according to example embodiments.

FIG. 5A is a current-voltage graph obtained by measuring current-voltage characteristics of a non-volatile memory device wherein a second oxide layer is formed of IZO (InZO) according to example embodiments. The second oxide layer is formed between lower and upper electrodes. The lower and upper electrodes are formed of an iridium oxide ($IrO_x$).

Figure 5B:
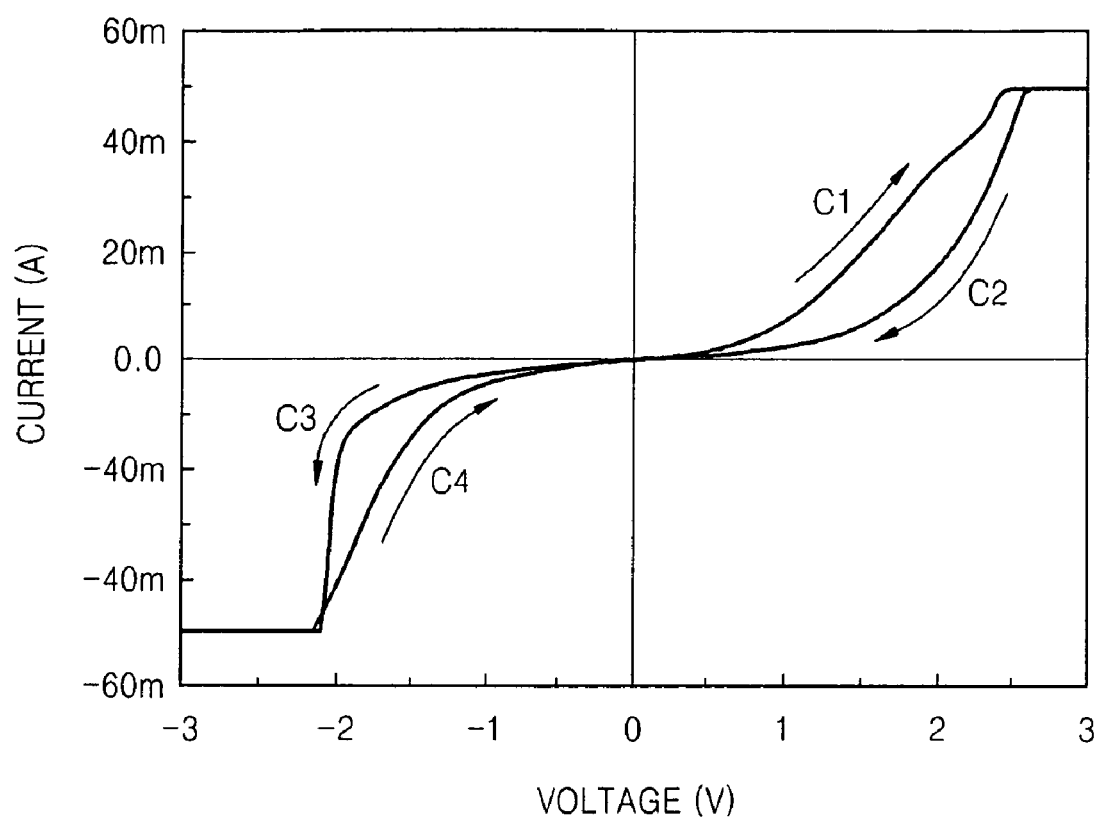
FIG. 5B is a current-voltage graph obtained by measuring current-voltage characteristics of a non-volatile memory device wherein the first oxide layer is formed of a titanium oxide ($TiO_x$) according to example embodiments.

FIG. 5B is a current-voltage graph obtained by measuring current-voltage characteristics of a non-volatile memory device wherein the first oxide layer is formed of a titanium oxide ($TiO_x$) according to example embodiments. The first oxide layer is formed between lower and upper electrodes. The lower electrode is formed of an iridium oxide ($IrO_x$) and the upper electrode formed of platinum (Pt).

Referring to FIGS. 5A and 5B, the second oxide layer formed of IZO and the first oxide layer formed of the titanium oxide ($TiO_x$) may have variable resistance states with respect to the applied voltages (e.g., $B_1 \rightarrow B_2 \rightarrow B_3 \rightarrow B_4$ or $C_1 \rightarrow C_2 \rightarrow C_3 \rightarrow C_4$).

Referring to FIG. 4, if a positive (+) voltage is gradually applied to the upper electrode, then the current flowing through the first oxide layer and the second oxide layer gradually increases as shown in curve $A_1$. Because the first oxide layer may be in a relatively higher resistance state, the current flowing through the first oxide layer may have a smaller magnitude.

If a positive (+) voltage is applied from 0 V to $M_2$ through the upper electrode, then oxygen ions may move from the titanium dioxide ($TiO_2$) of the first oxide layer toward the upper electrode, lowering the resistance state of the first oxide layer as if the first oxide layer is formed of TiO or $Ti_2O_3$ instead of $TiO_2$.

If the first oxide layer is formed of $V_2O_5$, then the first oxide layer may be a structure having fewer oxygen ions similar to $VO_2$. If the first oxide layer is formed of $Nb_2O_5$, the first oxide layer may be a structure having fewer oxygen ions similar to $NbO_2$.

The second oxide layer formed of IZO may be an amorphous material. The second oxide layer formed of IZO may have a substantial number defects. Although oxygen ions may move from the first oxide layer to the second oxide layer, the resistance of the second oxide layer may not vary. By applying a voltage increasing from 0 V to $M_2$, the non-volatile memory device having at least two oxide layers may vary from a higher resistance state ($RS_{high}$) to a lower resistance state ($RS_{low}$).

If a resistance state of the non-volatile memory device is lowered by gradually decreasing the applied voltage, then the current flowing through the first oxide layer and the second oxide layer may vary as shown in curve $A_2$. As such, the non-volatile memory device having at least two oxide layers may have a higher resistance state ($RS_{high}$) and a lower resistance state ($RS_{low}$). If the higher resistance state is designated as a value "0" and the lower resistance state is designated as value "1", then the non-volatile memory device may function as a memory device. For example, in order to read information stored in the non-volatile memory device, the voltage $M_1$ may be applied and the current flowing through the first oxide layer and the second oxide layer may be measured.

In order to change the lower resistance state into the higher resistance state, a negative (−) voltage may be applied through the upper electrode. Because the non-volatile memory device is in the lower resistance state, by increasing the negative (−) voltage applied through the upper electrode, the current flowing through the first oxide layer and the second oxide layer may vary as shown in curve $A_3$. Because the negative (−) voltage is applied through the upper electrode, oxygen ions in the second oxide layer move to the first oxide layer. If the negative (−) voltage is applied through the upper electrode and the applied voltage increases, then the first oxide layer may vary from the lower resistance state to the higher resistance state. If the resistance state of the first oxide layer is lowered by decreasing the negative (−) voltage applied, then the current may vary as shown in curve $A_4$.

A process for writing information in a non-volatile memory device will now be described.

If "0" is written in the non-volatile memory device, then a voltage of −$M_2$ may be applied in order to increase the resistance state of the first oxide layer. If "1" is written in the non-volatile memory device, then a voltage of +$M_2$ may be applied in order to lower the resistance state of the first oxide layer. The amplitude of the negative (−) voltage for converting the first oxide layer from the lower resistance state to the higher resistance state, or the amplitude of the positive (+) voltage for converting the first oxide layer from the higher resistance state to the lower resistance state, may depend on the thicknesses and materials of the respective layers. The change in resistance states may be obtained by a less complex current-voltage measurement.

As described above, by applying a positive (+) voltage to an upper electrode of a non-volatile memory device having at least two oxide layers, oxygen ions of a first oxide layer may move to a second oxide layer. The first oxide layer may be an n-type semiconductor layer. A lower portion of the second oxide layer may be a p-type semiconductor layer. An upper portion of the second oxide layer may function as an oxide layer having a variable resistance. The non-volatile memory device may be a memory device having an IDIR structure. As such, it may not be necessary to separately form switching devices (e.g., transistors, diodes and likewise). The non-volatile memory device may be used as a unit device and/or in an array form of a cross point structure.

As described above, a non-volatile memory device having at least two oxide layers according to example embodiments may achieve more reliable switching through a more simple structure. The non-volatile memory device may be manufactured at a cheaper cost because separate devices (e.g., diodes or transistors) are not necessary.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. An electrode structure, comprising:
    a lower electrode;
    a first oxide layer formed on the lower electrode, wherein the first oxide layer is formed of an oxide having a variable oxidation state;
    a second oxide layer formed on the first oxide layer; and
    an upper electrode formed on the second oxide layer,
    wherein at least one of the first and second oxide layers are formed of a resistance-varying material.

2. The electrode structure of claim 1, wherein the lower electrode is formed of a metal that forms a schottky contact with the first oxide layer.

3. The electrode structure of claim 2, wherein metal is at least one selected from the group consisting of platinum (Pt), ruthenium (Ru) and iridium (Ir).

4. The electrode structure of claim 2, wherein the metal is a metal oxide.

5. The electrode structure of claim 4, wherein the metal oxide is at least one selected from the group consisting of platinum oxide, a ruthenium oxide and an iridium oxide.

6. The electrode structure of claim 2, wherein the metal is titanium (Ti) or silver (Ag).

7. The electrode structure of claim 1, wherein the first oxide layer is formed of a transition metal oxide.

8. The electrode structure of claim 7, wherein the transition metal oxide is formed of at least one selected from the group consisting of NiO, $CeO_2$, $VO_2$, $V_2O_5$, $Nb_2O_5$, $TiO_2$, $Ti_2O_3$, $WO_3$, $Ta_2O_5$ and $ZrO_2$.

9. The electrode structure of claim 7, wherein the upper electrode is a metal.

10. The electrode structure of claim 9, wherein the metal is at least one selected from the group consisting of platinum (Pt), ruthenium (Ru) and iridium (Ir).

11. The electrode structure of claim 9, wherein the metal is a metal oxide.

12. The electrode structure of claim 11, wherein the metal oxide is at least one selected from the group consisting of a platinum oxide, a ruthenium oxide and an iridium oxide.

13. The non-volatile memory device of claim 11, wherein the first oxide layer is formed of a transition metal oxide.

14. The non-volatile memory device of claim 11, wherein the second oxide layer is formed of an amorphous oxide.

15. The electrode structure of claim 1, wherein the second oxide layer is formed of an amorphous oxide.

16. The electrode structure of claim 15, wherein the amorphous oxide is formed of InZnO (IZO) or InSnO (ITO).

17. A non-volatile memory device, comprising:
a substrate including a first and second impurity region;
a gate electrode including a conductive layer and a capping layer sequentially stacked on the substrate and contacting the first and second impurity regions;
an interlayer formed on the gate electrode, the first impurity region and the second impurity region;
a conductive plug formed in the interlayer and contacting one of the first or second impurity regions; and
the electrode structure according to claim 1 formed on the conductive plug and a portion of the interlayer.

18. The non-volatile memory device of claim 17, wherein the lower electrode is formed of a metal that forms a schottky contact with the first oxide layer.

19. The non-volatile memory device of claim 18, wherein the metal is a metal oxide.

* * * * *